United States Patent
Smailes et al.

(10) Patent No.: US 11,765,854 B2
(45) Date of Patent: Sep. 19, 2023

(54) UNIVERSAL EQUIPMENT RACK FOR TELECOMMUNICATIONS CABINETS

(71) Applicant: CommScope Technologies LLC, Hickory, NC (US)

(72) Inventors: Richard John Smailes, North Yorkshire (GB); Christopher Ashurst, North Yorkshire (GB)

(73) Assignee: CommScope Technologies LLC, Hickory, NC (US)

( * ) Notice: Subject to any disclaimer, the term of this patent is extended or adjusted under 35 U.S.C. 154(b) by 45 days.

(21) Appl. No.: 17/522,154

(22) Filed: Nov. 9, 2021

(65) Prior Publication Data

US 2022/0159866 A1 May 19, 2022

Related U.S. Application Data

(60) Provisional application No. 63/115,088, filed on Nov. 18, 2020.

(51) Int. Cl.
*H05K 7/00* (2006.01)
*H05K 7/18* (2006.01)

(52) U.S. Cl.
CPC .............. *H05K 7/183* (2013.01); *H05K 7/186* (2013.01)

(58) Field of Classification Search
CPC .... H05K 7/1489; H05K 7/1488; H05K 7/183; H05K 7/186; H05K 5/0221; H05K 5/0217; H05K 5/03; H04Q 1/025; H04Q 1/09
USPC ..... 174/50, 100; 248/68.1, 49, 205.1, 200.1, 248/201, 220.21; 211/26, 175, 189; 312/265.1–265.4, 223.1
See application file for complete search history.

(56) References Cited

U.S. PATENT DOCUMENTS

| | | | | |
|---|---|---|---|---|
| 5,593,115 A | * | 1/1997 | Lewis | F16L 3/227 248/200.1 |
| 6,079,677 A | * | 6/2000 | Daoud | H02G 3/16 248/298.1 |
| 6,666,419 B1 | * | 12/2003 | Vrame | H02G 3/125 248/200.1 |
| 6,769,551 B2 | | 8/2004 | Rafferty et al. | |

(Continued)

FOREIGN PATENT DOCUMENTS

| | | | |
|---|---|---|---|
| CN | 209929795 | * | 1/2020 |
| DE | 202007010248 | * | 9/2007 |
| EP | 4002969 | * | 5/2022 |

OTHER PUBLICATIONS

English translation of DE 202007010248 (Year: 2007).*

(Continued)

*Primary Examiner* — Janet M Wilkens
(74) *Attorney, Agent, or Firm* — Myers Bigel, P.A.

(57) ABSTRACT

The present disclosure describes an equipment rack for a telecommunications cabinet. The equipment rack allows a telecommunications cabinet to be reconfigured such that telecommunications equipment can be vertically mounted therein. The equipment rack includes a structural rail configured to be mounted within the telecommunications cabinet, an insert plate configured to fit within a cavity of the structural rail and be secured to the structural rail, and a bracket configured to be secured to the to the insert plate and configured such that a piece of telecommunications equipment can be mounted thereto.

18 Claims, 7 Drawing Sheets

(56) References Cited

U.S. PATENT DOCUMENTS

| | | | |
|---|---|---|---|
| 8,215,597 B1* | 7/2012 | Medlin, Sr. | H05K 5/0204 |
| | | | 248/200.1 |
| 8,556,357 B2* | 10/2013 | Fan | H05K 7/1488 |
| | | | 312/265.4 |
| 8,967,744 B2* | 3/2015 | Chen | H05K 7/1489 |
| | | | 312/334.4 |
| 10,716,235 B1* | 7/2020 | Farnsworth | H05K 7/1474 |
| 10,743,437 B2 | 8/2020 | Ankarbjörk et al. | |
| 2006/0237601 A1* | 10/2006 | Rinderer | H02G 3/125 |
| | | | 248/200.1 |
| 2007/0251893 A1* | 11/2007 | Huang | F16M 13/02 |
| | | | 211/26 |
| 2014/0076828 A1* | 3/2014 | Liu | H05K 7/20172 |
| | | | 211/26 |
| 2016/0084428 A1* | 3/2016 | Cayer | F16M 11/045 |
| | | | 361/679.21 |
| 2017/0215587 A1* | 8/2017 | Jost | H05K 7/1488 |
| 2017/0280580 A1 | 9/2017 | Nguyen et al. | |
| 2020/0163248 A1* | 5/2020 | Chen | H05K 7/1491 |

OTHER PUBLICATIONS

English translation of CN209929795 (Year: 2020).*
Extended European Search Report issued in corresponding European Application No. 21208444.6, dated Apr. 21, 2022.

* cited by examiner

UNIVERSAL EQUIPMENT RACK FOR TELECOMMUNICATIONS CABINETS

RELATED APPLICATION(S)

The present application claims priority to and the benefit of U.S. Provisional Patent Application Ser. No. 63/115,088, filed Nov. 18, 2020, the disclosure of which is hereby incorporated herein in full.

FIELD

The present invention relates generally to telecommunications cabinets, and more specifically to a universal equipment rack for telecommunications cabinets.

BACKGROUND

Outdoor telecommunications cabinets have become popular in recent years. They can protect a wide range of telecommunications equipment including radios, multicarrier power amplifiers (MCPA), combiners, power supplies, batteries, and wireless cell site backhaul equipment. These cabinets can protect base station equipment from environmental conditions while minimizing operating expenses and energy consumption.

Typically, telecommunications cabinets have racks adjacent their vertical walls for mounting equipment horizontally within the cabinet (i.e., stacking radios in a flat configuration). Electronic equipment (which may include AC/DC rectifiers, Radio Baseband units, network routers, Fiber test and management devices, alarm interface components, and current and surge protection devices) is conventionally mounted in standard 19" or 23" width rack structures. However, new radios do not fit this standard with the main body of the radio unit acting as a heat sink and requiring vertical mounting. It may be desirable to provide rack configurations that enhance flexibility of mounting equipment within the cabinet.

SUMMARY

A first aspect of the present invention is directed to an equipment rack for a telecommunications cabinet. The equipment rack includes a structural rail configured to be mounted within the telecommunications cabinet, the structural rail having a main body and four walls extending outwardly from the main body to define a cavity, wherein the main body includes a plurality of holes and/or slots; an insert plate including one or more plate mounting holes and a plurality of bracket mounting holes, wherein the insert plate is configured to fit within the cavity of the structural rail and secured to the structural rail via fasteners through the plate mounting holes; and a bracket having a main body including a plurality of mounting holes, wherein the bracket is configured to be secured to the to the insert plate via fasteners when one or more of the mounting holes of the bracket are aligned with respective bracket mounting holes of the insert plate, and wherein the bracket is configured such that a piece of telecommunications equipment can be mounted thereto.

Another aspect of the present invention is directed to a telecommunications cabinet. The telecommunications cabinet includes a cabinet enclosure having two opposed side walls, a ceiling, a floor, and a center support member extending between the ceiling and the floor; a first vertical rail mounted to a side wall; a second vertical rail mounted to the center support member; and an equipment rack. The equipment rack includes a structural rail mounted to the first and second vertical rails, the structural rail having a main body and four walls extending outwardly from the main body to define a cavity, wherein the main body includes a plurality of holes and/or slots; an insert plate including one or more plate mounting holes and a plurality of bracket mounting holes, wherein the insert plate is secured to the structural rail within the cavity of the structural rail via fasteners through the plate mounting holes; and a bracket having a main body including a plurality of mounting holes, wherein the bracket is secured to the to the insert plate via fasteners through one or more of the mounting holes of the bracket. One or more pieces of telecommunications equipment is secured to the bracket and mounted vertically within the telecommunications cabinet.

Another aspect of the present invention is directed to a method of reconfiguring a telecommunications cabinet to allow vertical mounting of telecommunications equipment. The method includes (a) providing a cabinet enclosure having two opposed side walls, a ceiling, a floor, and a center support member extending between the ceiling and the floor, a first vertical rail mounted to a side wall and a second vertical rail mounted to the center support member; (b) providing an equipment rack including a structural rail having a main body and four walls extending outwardly from the main body to define a cavity, wherein the main body includes a plurality of holes and/or slots, an insert plate comprising one or more plate mounting holes and a plurality of bracket mounting holes, and a bracket having a main body including a plurality of mounting holes and a hanging member extending outwardly from the main body; (c) securing the side walls of the structural rail of the equipment rack to the first and second vertical rails; (d) inserting the insert plate into the cavity of the structural rail such that the plate mounting holes of the insert plate align with one or more holes of the structural rail and the bracket mounting holes of the insert plate align with respective slots of the structural rail; (e) securing the insert plate to the structural rail via fasteners through the plate mounting holes of the insert plate and received through the corresponding holes in the structural rail; (f) securing the bracket of the equipment rack to a piece of telecommunications equipment; (g) mounting the bracket and telecommunications equipment onto the structural rail by engaging the hanging member with a top wall of the structural rail; (h) sliding the bracket along the top wall of the structural rail until the mounting holes of the bracket align with the bracket mounting holes of the insert plate; and (i) securing the bracket to the insert plate and structural rail via fasteners, thereby securing the telecommunications equipment to the equipment rack with the telecommunications cabinet.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim and/or file any new claim accordingly, including the right to be able to amend any originally filed claim to depend from and/or incorporate any feature of any other claim or claims although not originally claimed in that manner. These and other objects and/or aspects of the present invention are explained in detail in the specification set forth below. Further features, advantages and details of the present invention will be appreciated by those of ordinary skill in the art from a reading of the figures and the detailed description of the preferred embodiments that follow, such description being merely illustrative of the present invention.

DETAILED DESCRIPTION

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Figure 1A:
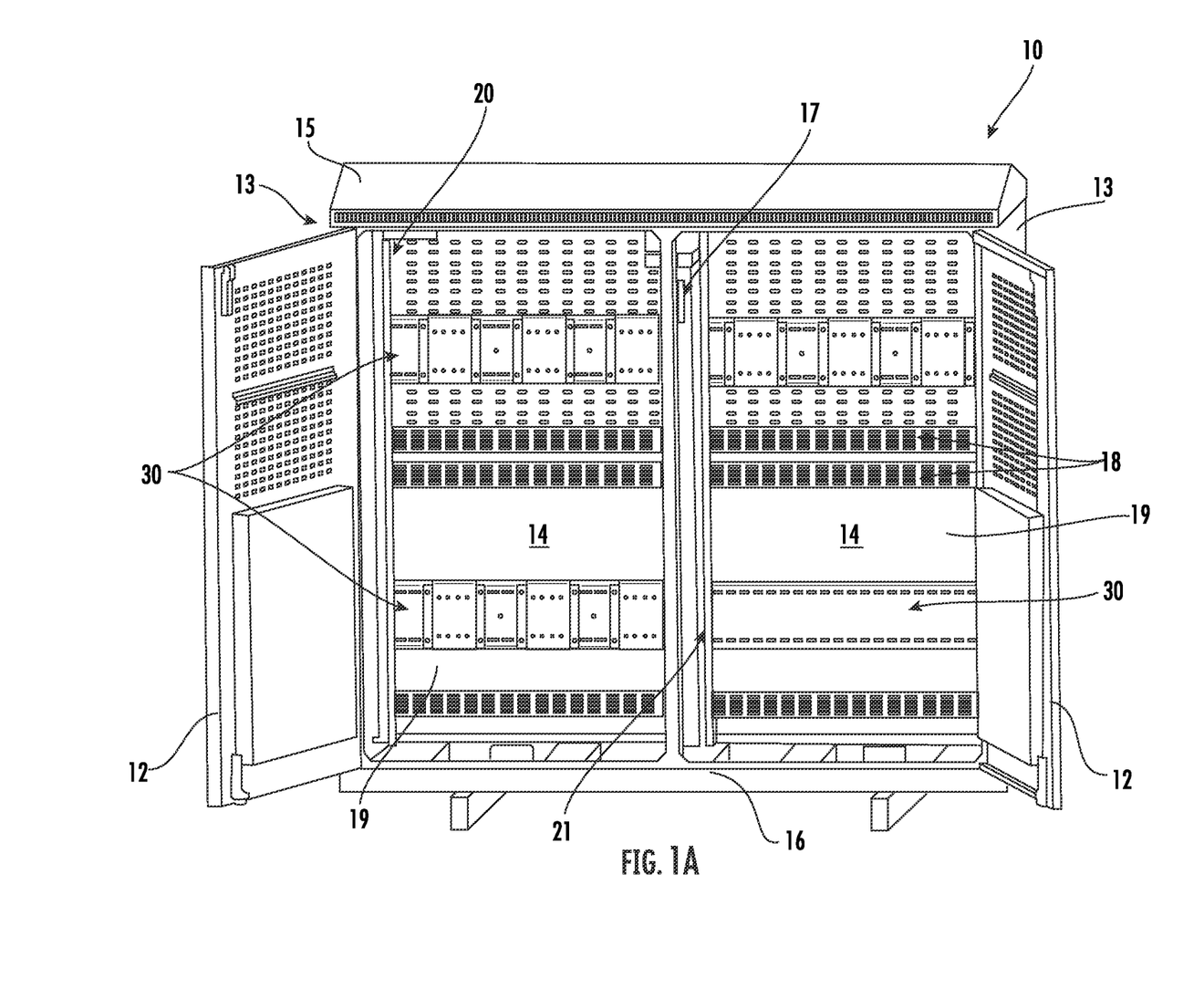
FIG. 1A is a front perspective view of a telecommunications cabinet including a universal equipment rack according to embodiments of the present invention.
Figure 1B:
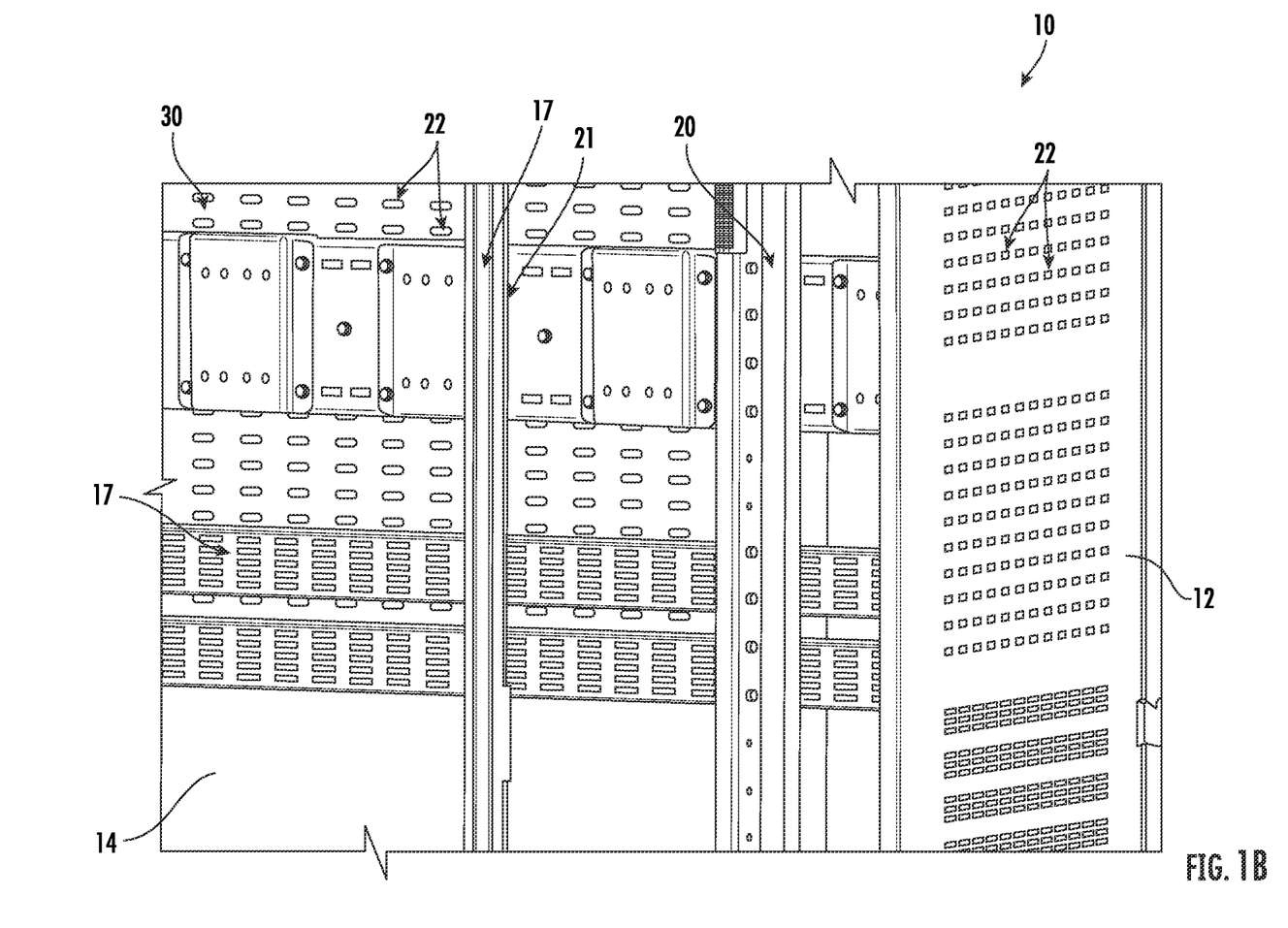
FIG. 1B is an enlarged perspective view of the telecommunications cabinet of FIG. 1A.
Figure 6:
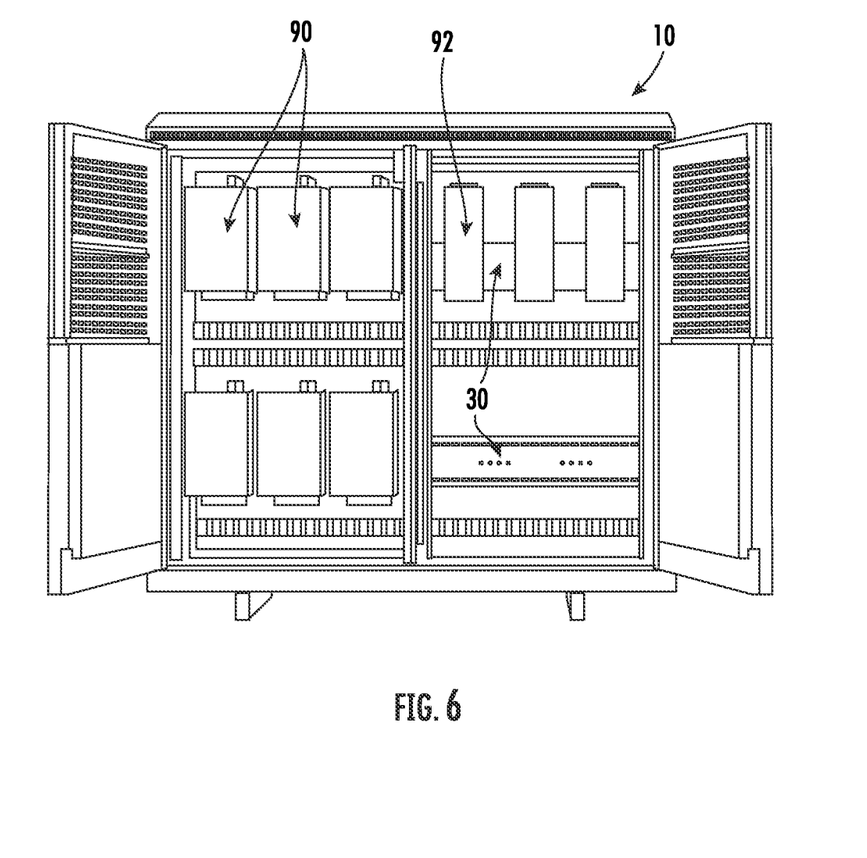
FIG. 6 is a perspective view of a telecommunications cabinet with radios mounted to the equipment rack according to embodiments of the present invention.

Referring now to the figures, a telecommunications cabinet, designated broadly at 10, is illustrated in FIGS. 1A-1B. The cabinet 10 may be of conventional construction and need not be described in detail herein. In some embodiments, the cabinet 10 is designed around the standard 19" rack. In some embodiments, the cabinet 10 is generally box-shaped, with opposing side walls 13, a ceiling 15, and a floor 16. In some embodiments, a center support member 17 extends between the ceiling 15 and the floor 16 and divides the cabinet 10 into two approximately equal compartments or sections 14. Each compartment 14 of the cabinet 10 has a removable rear wall 19 which allows easy access to the back of telecommunications equipment 90, 92 mounted within the cabinet 10. A door 12 is pivotably coupled to each side wall 13. In some embodiments, the side walls 13, doors 12, and/or rear walls 19 may comprise perforations 22 which allow air to circulate within the cabinet 10 to help prevent telecommunications equipment 90, 92 mounted within the cabinet 10 from overheating (FIG. 6).

A vertical rail 20 (also seen in FIGS. 1B, 5B, and 5C) is mounted to each of the side walls 13. Additional vertical rails 21 are mounted to the center support member 17. As described in further detail below, the vertical rails 20, 21 are positioned to provide mounting locations for an equipment rack 30 according to embodiments of the present invention (i.e., mounting one or more equipment racks 30 within a section 14 of the cabinet 10). The vertical rails 20, 21 also provide mounting locations for support rails 18 which provide additional structural support to the cabinet 10.

Figures 2, 3:
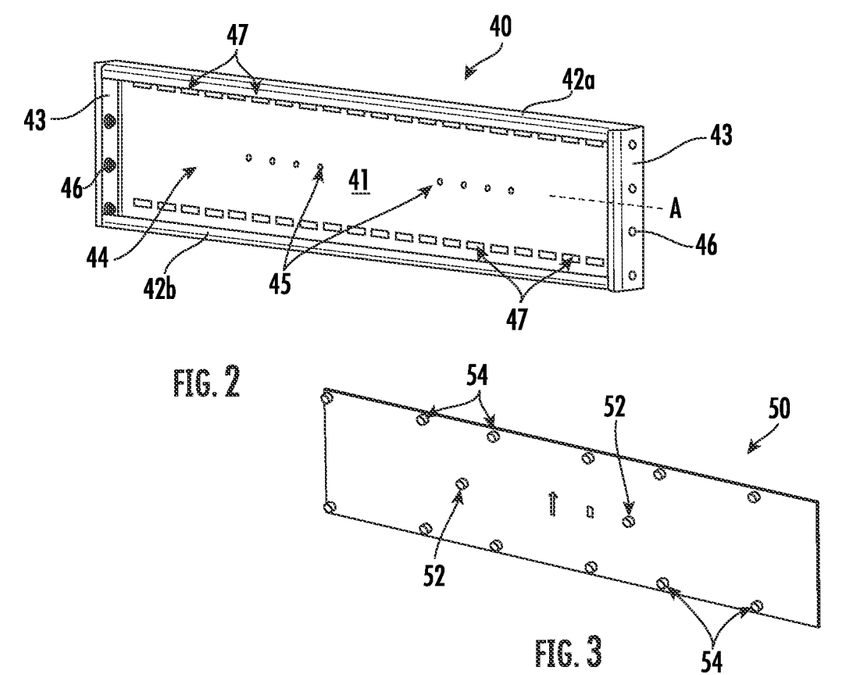
FIG. 2 is a perspective view of a structural rail for the universal equipment rack shown in FIG. 1A according to embodiments of the present invention.
FIG. 3 is a perspective view of an insert plate for the universal equipment rack shown in FIG. 1A according to embodiments of the present invention.
Figure 4:
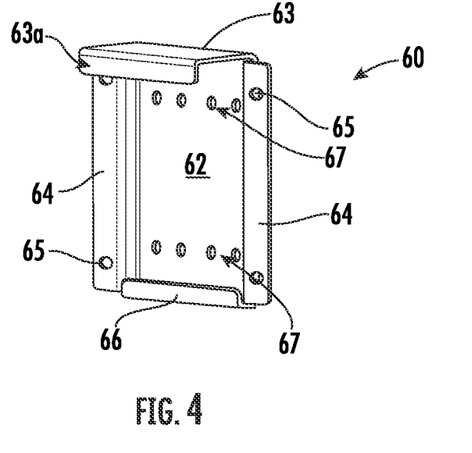
FIG. 4 is a rear perspective view of a bracket for the universal equipment rack shown in FIG. 1A.
Figure 5A:
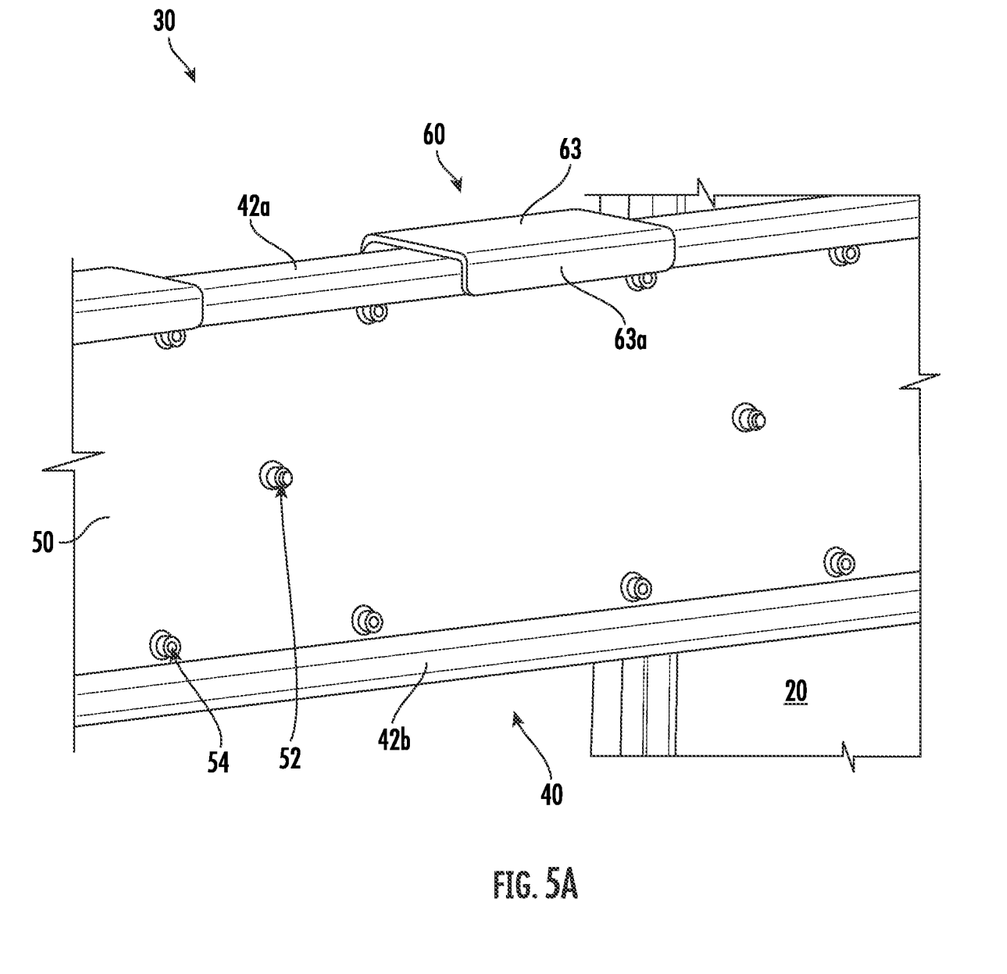
FIG. 5A is an enlarged view of the universal equipment rack mounted within a telecommunications cabinet according to embodiments of the present invention.
Figure 5B:
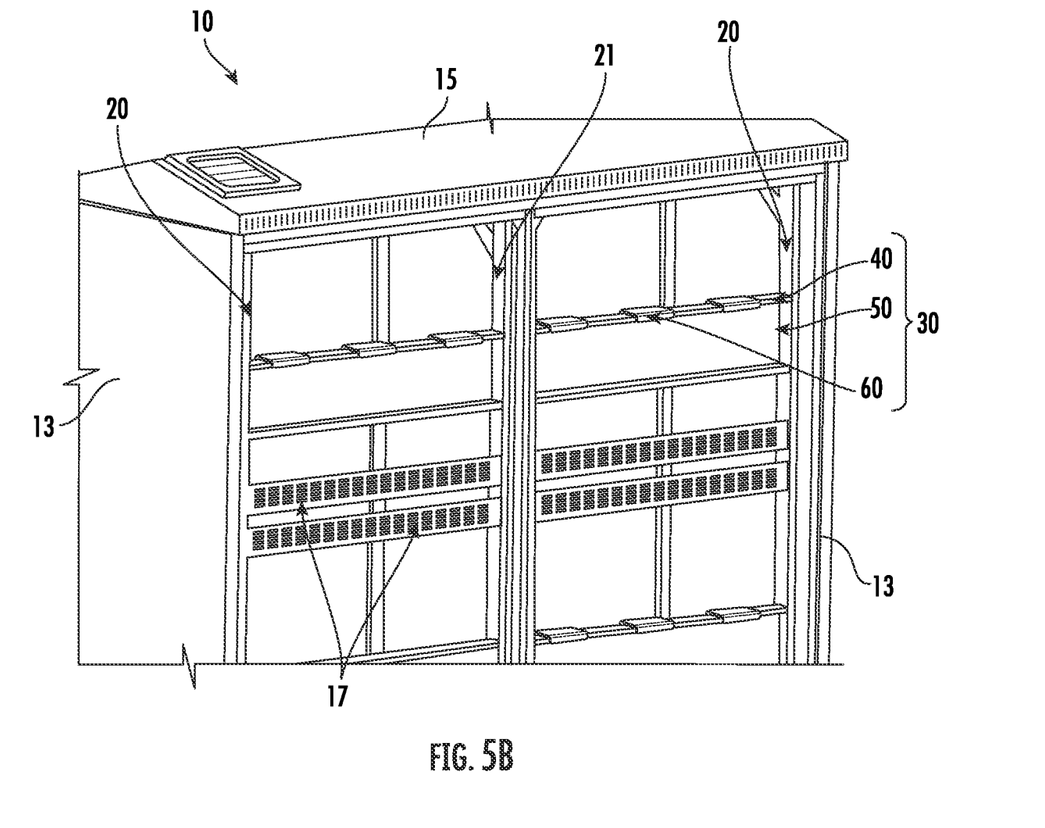
FIG. 5B is a rear perspective view of the telecommunications cabinet with the universal equipment rack mounted therein according to embodiments of the present invention.
Figure 5C:
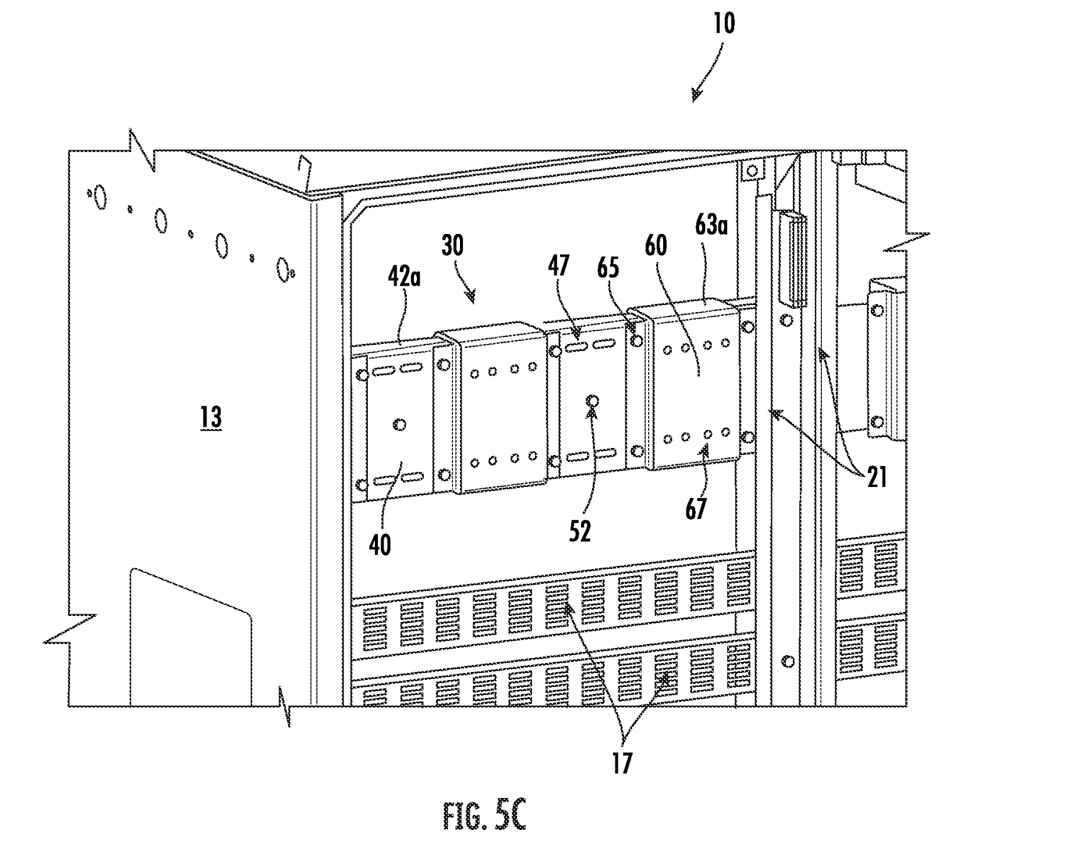
FIG. 5C is an enlarged front perspective view of the telecommunications cabinet assembly of FIG. 5B.

Referring now to FIGS. 2-4, the components of the equipment rack 30 according to embodiments of the present invention are illustrated (see also, e.g., FIGS. 5A-5C). The components of the equipment rack 30 include a structural rail 40 (FIG. 2), an insert plate 50 (FIG. 3), and an equipment mounting bracket 60 (FIG. 4). The equipment rack 30 of the present invention may be used with a standard telecommunication cabinet 10 described herein. In some embodiments, the equipment rack 30 may be used to mount telecommunications equipment 90, 92 (e.g., passively cooled radios) within the cabinet 10 (see, e.g., FIG. 6). The equipment rack 30 of the present invention may allow a telecommunications cabinet 10 that has been deployed in the field to be reconfigured to accept radio equipment 90, 92 from a different manufacturer (i.e., allowing different sizes and/or types of radio equipment 90, 92 to be mounted within the cabinet 10), thereby providing a cost effective and standardized radio mounting solution. For example, a standard cabinet 10 that is configured to mount equipment horizontally within the cabinet 10 (i.e., stacking radios in a flat configuration) may be reconfigured by utilizing the equipment rack 30 of the present invention to allow the equipment to be vertically mounted within the cabinet 10.

The first component of the equipment rack 30 of the present invention, i.e., the structural rail 40, is shown in FIG. 2. The structural rail 40 is generally rectangularly shaped, with a main body 41 and four walls (i.e., a top wall 42a, a bottom wall 42b, and opposing side walls 43) that extend radially outwardly from the main body 41. The four walls 41 define a cavity 44 that is sized and configured to receive an insert plate 50 (see, e.g., FIG. 3). Each side wall 43 comprises a plurality of mounting apertures 46 that allow the structural rail 40 to be mounted and secured to vertical rails 20, 21 (e.g., via bolts) within the telecommunications cabinet 10.

The main body 41 of the structural rail 40 comprises a series of holes 45. As shown in FIG. 2, in some embodiments, the series of holes 45 are positioned longitudinally along a center axis A of the structural rail 40. As discussed in further detail below, the holes 45 within the main body 41 provide location(s) to secure the insert plate 50 to the structural rail 40. As shown in FIG. 2, in some embodiments, the structural rail 40 may comprise eight (8) holes 45. In some embodiments, the holes 45 may be grouped into two sets of four (4) holes 45, with each hole 45 in a set being separated by a distance of approximately 38 mm. In some embodiments, the two sets of holes 45 may be spaced apart a distance of approximately 190 mm (i.e., the distance between the two holes 45 closest to the center of the structural rail 40).

In some embodiments, the main body 41 of the structural rail 40 may also comprise two rows of elongate or oblong slots 47. Each row of slots 47 may be positioned within the main body 41 adjacent to the top and bottom walls 42a, 42b of the structural rail 41, respectively. As discussed in further detail below, the slots 47 within the main body 41 provide location(s) to secure the radio mount bracket 60 (see FIG. 4) to the structural rail 40 and also allow for different insert plates 50 and brackets 60 (which correspond to different radio equipment 90, 92) to be used with the structural rail 40. As shown in FIG. 2, in some embodiments, each row may comprise twenty-one (21) slots 47. In some embodiments, each adjacent slot 47 within a row may be separated by a distance of approximately 38 mm (measured to the center of each slot 47). Each slot 47 may have a length of approximately 21.5 mm.

The second component of the equipment rack 30 of the present invention, i.e., the insert plate 50, is shown in FIG. 3. The insert plate 50 is generally rectangularly shaped and is sized and configured to fit within the cavity 44 of the structural rail 40. The insert plate 50 is specific to the radio equipment 90, 92 that will be mounted within the telecommunications cabinet 10, but is universal to the structural rail 40. The insert plate 50 comprises a pair of plate mounting holes 52 residing along a center axis of the insert plate 50. Each plate mounting hole 52 is positioned to align with a respective hole 45 in the structural rail 40 such that the insert plate 50 may be fastened to the structural rail 40.

The insert plate 50 further comprises a plurality of bracket mounting holes 54 (e.g., captive female threads). The bracket mounting holes 54 are positioned adjacent to the top and bottom edges of the insert plate 50 such that each of the bracket mounting holes 54 align with a respective slot 47 in the main body 41 of the structural rail 40. As discussed in further detail below, when the insert plate 50 is fastened to the structural rail 40 via the plate mounting holes 52, each of the bracket mounting holes 54 will align within a respective slot 47 and are positioned in the exact location to provide the correct positioning and spacing for the corresponding radio equipment 90, 92 (e.g., with the corresponding radio mount bracket 60) that will be mounted on the equipment rack 30 and within the telecommunications cabinet 10.

The third component of the equipment rack 30 of the present invention, i.e., radio mounting bracket 60, is shown in FIG. 4. Similar to the insert plate 50, the radio mount bracket 60 is specific to the radio equipment 90, 92 that will be mounted within the telecommunications cabinet 10, but is universal to the structural rail 40. As shown in FIG. 4, the bracket 60 has a main body 62 with a pair of flanges 64 that extend radially outwardly from opposing sides of the main body 62. The main body 62 has a plurality of mounting holes 67. The mounting holes 67 are configured such that the corresponding radio equipment 90, 92 may be secured to the bracket 60 (e.g., via bolts) (FIG. 6).

The radio mounting bracket 60 includes a hanging member 63 that extends radially outwardly from a top edge of the main body 62. The hanging member 63 is configured engage the top wall 42a of the structural rail 40 (e.g., via flanged edge 63a) to provide additional structural support when the bracket 60 (and radio equipment 90, 92) is secured to the structural rail 40 (see, e.g., FIG. 5A and FIG. 5C). In some embodiments, the bracket 60 may further include a support member 66 that extends radially outwardly from the bottom edge of the main body 62. The support member 66 may help to position the bracket 60 flush against the structural rail 40, thereby providing additional structural support to the radio mounting bracket 60.

Each flange 64 has a pair of mounting holes 65. When the bracket 60 is placed on the structural rail 40, each mounting hole 65 aligns with a corresponding bracket mounting hole 54 in the insert plate 50 (and a slot 47 in the structural rail 40). The radio mounting bracket 60 may be secured to the insert plate 50 (and thus, the structural rail 40) via bolts through the mounting holes 65. Alignment of the mounting holes 65 of the bracket 60 with the respective bracket mounting holes 54 of the insert plate 50 position the radio mounting bracket(s) 60 in the exact location on the structural rail 40, thereby allowing the corresponding radio equipment 90, 92 to be positioned correctly with the appropriate spacing within the telecommunications cabinet 10.

Referring to FIGS. 5A-5C, a technician can reconfigure an existing telecommunications cabinet 10 to allow the vertical mounting of radio equipment 90, 92 within the telecommunications cabinet 10 by utilizing the equipment rack 30 of the present invention.

First, a universal structural rail 40 is secured to the vertical rails 20, 21 within the telecommunications cabinet 10. Next, an insert plate 50 corresponding to the radio equipment 90, 92 to be mounted within the cabinet 10 (i.e., having a particular mounting hole 52, 54 pattern) is placed within the cavity 44 of the structural rail 40. When the insert plate 50 is mounted within the cavity 44 of the structural rail 40, the bracket mounting holes 54 will align with respective slots 47 in the structural rail 40. The insert plate 50 is secured to the structural rail 40 via fasteners (e.g., bolts) inserted through the plate mounting holes 52 of insert plate 50 and received through corresponding holes 45 of the structural rail 40.

Next, each radio mounting bracket 60 may be secured to a respective piece of radio equipment 90, 92 via fasteners (e.g., bolts) inserted through mounting holes 67. The radio mounting bracket 60 (and mounted radio equipment 90, 92) may then be mounted onto the structural rail 40 by utilizing the hanging member 63 which engages the top wall 42a of the structural rail 40 via flanged edge 63a. The hanging member 63 is configured to support the weight of the radio equipment 90, 92 and hold the bracket 60 and radio equipment 90, 92 on the structural rail 40. This allows the technician to slide the bracket 60 (and mounted radio equipment 90, 92) along the top wall 42a of the structural rail 40 until the mounting holes 65 in the flanges 64 of the radio mounting bracket 60 align with bracket mounting holes 54 of the insert plate 50. This allows the technician to easily position the bracket 60 (and radio equipment 90, 92) on the structural rail 40 without having to continuously hold the heavy radio equipment 90, 92.

Once the mounting holes 66 of the bracket 60 are aligned with mounting holes 54 of the insert plate 50, the bracket 60 (and corresponding radio equipment 90, 92) may be secured to the equipment rack 30 via fasteners (e.g., bolts) inserted through the bracket mounting holes 54 of the insert plate 50 (and respective slots 47 of the structural rail 40) and received through corresponding holes 65 in the radio mounting bracket 60. Additional radio equipment 90, 92 may then be mounted within the telecommunications cabinet 10 in the same manner with alignment of the respective mounting holes 54, 65, thereby providing correct positioning and spacing for the corresponding radio equipment 90, 92 within the cabinet 10.

As shown in FIG. 6, the equipment rack 30 of the present invention allows for different sizes and/or types of radio equipment 90, 92 to be vertically mounted within a standard telecommunications cabinet 10. Exemplary radios that may be mounted utilizing the equipment rack 30 of the present invention may include, but are not limited to, Ericsson 4415, Ericsson 2238, Ericsson 4480, Ericsson 2460, Ericson 2012, Nokia AHPMDA, Nokia FZNJ, Nokia AZNC, and Huawei RRU5301.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. An equipment rack for a telecommunications cabinet, comprising:
 a structural rail configured to be mounted within the telecommunications cabinet, the structural rail having a main body and four walls extending outwardly from the main body to define a cavity, wherein the main body comprises a plurality of holes and/or slots;
 an insert plate comprising one or more plate mounting holes and a plurality of bracket mounting holes, wherein the insert plate is configured to fit within the cavity of the structural rail and be secured to the structural rail via fasteners through the plate mounting holes; and
 a bracket having a main body comprising a plurality of mounting holes and a hanging member extending outwardly from the main body, the hanging member being configured to engage a top wall of the structural rail, wherein the bracket is configured to be secured to the insert plate via fasteners inserted through one or more aligned mounting holes of the bracket and insert plate, and wherein the bracket is configured such that a piece of telecommunications equipment can be mounted thereto.

2. The equipment rack of claim 1, wherein the plurality of holes of the structural rail are positioned longitudinally along a center axis of the structural rail.

3. The equipment rack of claim 2, wherein the one or more plate mounting holes reside along a center axis of the insert plate and align with a respective hole within the structural rail.

4. The equipment rack of claim 1, wherein the structural rail comprises eight holes grouped into two sets of four holes with each hole in a set being spaced apart a distance of approximately 38 mm.

5. The equipment rack of claim 4, wherein the two sets of four holes are spaced apart a distance of approximately 190 mm.

6. The equipment rack of claim 1, wherein the structural rail comprises two rows of slots, each row of slots positioned with the main body of the structural rail adjacent to a top and bottom wall.

7. The equipment rack of claim 6, wherein each row of slots comprises twenty-one slots, each adjacent slot being spaced apart a distance of approximately 38 mm measured to the center of each slot.

8. The equipment rack of claim 1, wherein the bracket mounting holes of the insert plate are captive female threads.

9. The equipment rack of claim 1, wherein the bracket mounting holes of the insert plate are positioned adjacent to a top edge and a bottom edge of the insert plate such that each bracket mounting hole aligns with a respective slot in the main body of the structural rail.

10. The equipment rack of claim 1, wherein the bracket further comprises a pair of flanges extending radially outwardly from opposing sides of the main body, each flange comprising a pair of mounting holes, the pair of mounting holes configured to align with respective bracket mounting holes of the insert plate.

11. The equipment rack of claim 1, wherein the hanging member is configured to overhang the top wall of the structural rail to allow the hanging member to slide along the top wall of the structural rail during installation.

12. The equipment rack of claim 1, wherein the bracket further comprises a support member extending radially outward from a bottom edge of the main body configured to position the bracket flush against the structural rail.

13. A telecommunications cabinet, comprising:
a cabinet enclosure having two opposed side walls, a ceiling, a floor, and a center support member extending between the ceiling and the floor;
a first vertical rail mounted to one of the opposed side walls of the cabinet;
a second vertical rail mounted to the center support member of the cabinet; and
an equipment rack, the equipment rack comprising:
a structural rail mounted to the first and second vertical rails, the structural rail having a main body and four walls extending outwardly from the main body to define a cavity, wherein the main body comprises a plurality of holes and/or slots;
an insert plate comprising one or more plate mounting holes and a plurality of bracket mounting holes, wherein the insert plate is secured to the structural rail within the cavity of the structural rail via fasteners through the plate mounting holes; and
a bracket having a main body comprising a plurality of mounting holes and a hanging member extending outwardly from the main body, the hanging member being configured to engage a top wall of the structural rail, wherein the bracket is secured to the insert plate via fasteners inserted through one or more aligned mounting holes of the bracket and insert plate,
wherein one or more pieces of telecommunications equipment is secured to the bracket and mounted vertically within the telecommunications cabinet.

14. The telecommunications cabinet of claim 13, wherein the structural rail of the equipment rack comprises two rows of slots, each row of slots positioned with the main body of the structural rail adjacent to a top and bottom wall.

15. The telecommunications cabinet of claim 13, wherein the bracket mounting holes of the insert plate are positioned adjacent to a top edge and a bottom edge of the insert plate such that each bracket mounting hole aligns with a respective slot in the main body of the structural rail.

16. The telecommunications cabinet of claim 13, wherein the bracket of the equipment rack further comprises a pair of flanges extending radially outwardly from opposing sides of the main body, each flange comprising a pair of mounting holes, the pair of mounting holes configured to align with respective bracket mounting holes of the insert plate.

17. The telecommunications cabinet of claim 14, wherein the hanging member is configured to overhang the top wall of the structural rail to allow the bracket to slide along the top wall of the structural rail during installation.

18. A method of reconfiguring a telecommunications cabinet to allow vertical mounting of telecommunications equipment, the method comprising:
providing a cabinet enclosure having two opposed side walls, a ceiling, a floor, and a center support member extending between the ceiling and the floor, a first vertical rail mounted to one of the opposed side walls and a second vertical rail mounted to the center support member;
providing an equipment rack including a structural rail having a main body and four walls extending outwardly from the main body to define a cavity, wherein the main body comprises a plurality of holes and/or slots, an insert plate comprising one or more plate mounting holes and a plurality of bracket mounting holes, and a bracket having a main body comprising a plurality of mounting holes and a hanging member extending outwardly from the main body;
securing two of the walls of the structural rail of the equipment rack to the first and second vertical rails;
inserting the insert plate into the cavity of the structural rail such that the plate mounting holes of the insert plate align with one or more holes of the structural rail and the bracket mounting holes of the insert plate align with respective slots of the structural rail;
securing the insert plate to the structural rail via fasteners through the plate mounting holes of the insert plate and received through the corresponding holes in the structural rail;
securing the bracket of the equipment rack to a piece of telecommunications equipment;
mounting the bracket and telecommunications equipment onto the structural rail by engaging the hanging member with a top wall of the structural rail;
sliding the bracket along the top wall of the structural rail until the mounting holes of the bracket align with the bracket mounting holes of the insert plate; and
securing the bracket to the insert plate and structural rail via fasteners, thereby securing the telecommunications equipment to the equipment rack with the telecommunications cabinet.

* * * * *

UNITED STATES PATENT AND TRADEMARK OFFICE
CERTIFICATE OF CORRECTION

| | |
|---|---|
| PATENT NO. | : 11,765,854 B2 |
| APPLICATION NO. | : 17/522154 |
| DATED | : September 19, 2023 |
| INVENTOR(S) | : Smailes et al. |

It is certified that error appears in the above-identified patent and that said Letters Patent is hereby corrected as shown below:

In the Claims

Column 10, Line 1, Claim 17: delete "claim 14" insert --claim 13--

Signed and Sealed this
Twelfth Day of December, 2023

*Katherine Kelly Vidal*

Katherine Kelly Vidal
*Director of the United States Patent and Trademark Office*